(12) United States Patent
Durand et al.

(10) Patent No.: US 11,393,678 B2
(45) Date of Patent: Jul. 19, 2022

(54) LOW-K DIELECTRIC FILMS

(71) Applicant: Applied Materials, Inc., Santa Clara, CA (US)

(72) Inventors: William J. Durand, Oakland, CA (US); Mark Saly, Santa Clara, CA (US); Lakmal C. Kalutarage, San Jose, CA (US); Kang Sub Yim, Palo Alto, CA (US); Shaunak Mukherjee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 16/989,156

(22) Filed: Aug. 10, 2020

(65) Prior Publication Data

US 2021/0050212 A1 Feb. 18, 2021

Related U.S. Application Data

(60) Provisional application No. 62/885,666, filed on Aug. 12, 2019.

(51) Int. Cl.
*H01L 21/02* (2006.01)
*C23C 16/24* (2006.01)
(Continued)

(52) U.S. Cl.
CPC ........ *H01L 21/02211* (2013.01); *C23C 16/24* (2013.01); *C23C 16/308* (2013.01);
(Continued)

(58) Field of Classification Search
None
See application file for complete search history.

(56) References Cited

U.S. PATENT DOCUMENTS 7,109,098 B1 * 9/2006 Ramaswamy ........ H01L 21/314
438/513
2006/0165891 A1 7/2006 Edelstein et al.
(Continued)

FOREIGN PATENT DOCUMENTS

KR 20190062317 A 6/2019
WO 2019055393 A1 3/2019

OTHER PUBLICATIONS

PCT International Search Report and Written Opinion in PCT/US2020/045698 dated Nov. 18, 2020, 11 pages.
(Continued)

*Primary Examiner* — Asok K Sarkar
(74) *Attorney, Agent, or Firm* — Servilla Whitney LLC

(57) ABSTRACT

Methods for deposition of high-hardness low-κ dielectric films are described. More particularly, a method of processing a substrate is provided. The method includes flowing a precursor-containing gas mixture into a processing volume of a processing chamber having a substrate, the precursor having the general formula (I)

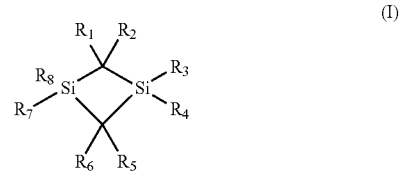

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide; maintaining the substrate at a pressure in a range of about 0.1 mTorr and about 10 Torr and at a temperature in a range of about 200° C. to about 500° C.;
(Continued)

and generating a plasma at a substrate level to deposit a dielectric film on the substrate.

18 Claims, 2 Drawing Sheets

(51) Int. Cl.
    *H01L 21/3205*     (2006.01)
    *H01L 21/683*     (2006.01)
    *C23C 16/50*     (2006.01)
    *C23C 16/34*     (2006.01)
    *C23C 16/32*     (2006.01)
    *C23C 16/40*     (2006.01)
    *C23C 16/36*     (2006.01)
    *C23C 16/30*     (2006.01)
    *H01L 27/11582*     (2017.01)
    *H01L 27/11556*     (2017.01)

(52) U.S. Cl.
    CPC ......... *C23C 16/325* (2013.01); *C23C 16/345* (2013.01); *C23C 16/36* (2013.01); *C23C 16/401* (2013.01); *C23C 16/50* (2013.01); *H01L 21/022* (2013.01); *H01L 21/0214* (2013.01); *H01L 21/0217* (2013.01); *H01L 21/02126* (2013.01); *H01L 21/02164* (2013.01); *H01L 21/02167* (2013.01); *H01L 21/02274* (2013.01); *H01L 21/32051* (2013.01); *H01L 21/32055* (2013.01); *H01L 21/6831* (2013.01); *H01L 27/11556* (2013.01); *H01L 27/11582* (2013.01)

(56) References Cited

U.S. PATENT DOCUMENTS

| | | | |
|---|---|---|---|
| 2007/0077682 A1* | 4/2007 | Cerio | ................ H01L 21/2855 438/99 |
| 2012/0152914 A1* | 6/2012 | Matsuura | ......... H01L 21/31138 219/121.42 |
| 2014/0302690 A1 | 10/2014 | Underwood et al. | |
| 2018/0122632 A1 | 5/2018 | Vrtis et al. | |

OTHER PUBLICATIONS

Baklanov, Mikhail R., et al., "Ultra Low Dielectric Constant Materials for 22 nm Technology Node and Beyond", ECS Transactions, 35 (4) 717-728 (2011).

Dubois, Geraud, et al., "Molecular Network Reinforcement of Sol-Gel Glasses", Adv. Mater. 2007, 19, 3989-3994.

Kim, Jin Yong, et al., "Origin of low dielectric constant of carbonincorporated silicon oxide film deposited by plasma enhanced chemical vapor deposition", Journal of Applied Physics 90, 2469 (2001), Aug. 23, 2001.

Li, Han, et al., "Stiffening of organosilicate glasses by organic cross-linking", Acta Materialia 59 (2011) 44-52.

Nenashev, R., et al., "Effect of Bridging and Terminal Alkyl Groups on Structural and Mechanical Properties of Porous Organosilicate Films", ECS Journal of Solid State Science and Technology, 6 (10) N182-N188 (2017), Oct. 4, 2017.

* cited by examiner

LOW-K DIELECTRIC FILMS

CROSS-REFERENCE TO RELATED APPLICATIONS

This application claims priority to U.S. Provisional Application No. 62/885,666, filed Aug. 12, 2019, the entire disclosure of which is hereby incorporated by reference herein.

TECHNICAL FIELD

Embodiments of the present disclosure pertain to the field of electronic device manufacturing, and in particular, to integrated circuit (IC) manufacturing. More particularly, embodiments of the disclosure provide methods of depositing low-κ dielectric films.

BACKGROUND

Integrated circuits have evolved into complex devices that can include millions of transistors, capacitors, and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced, it is necessary to use low resistivity conductive materials as well as low dielectric constant insulating materials to obtain suitable electrical performance from such components.

As the dimensions of an integrated circuit are reduced, there is a need for low-κ dielectric materials to mitigate the effects of capacitance between conducting wires. Conventional low-κ films are post-processed after deposition to reduce the dielectric constant (κ) by creating pores within the material. Producing pores within the material, however, reduces that hardness of films, resulting in integration issues during subsequent processing steps. Thus, there is a need for depositing high hardness low-κ dielectric films for patterning and other applications without using a post-treatment process.

SUMMARY

Apparatuses and methods to manufacture integrated circuits are described. In one or more embodiments, a method of forming film on a substrate is described. In one embodiment, a film is formed on a substrate by flowing a precursor-containing gas mixture into a processing volume of a processing chamber having a substrate. The precursor is of general formula (I)

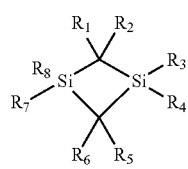

(I)

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide. The substrate is maintained at a pressure in a range of about 0.1 mTorr and about 10 Torr and at a temperature in a range of about 200° C. to about 500° C. A plasma is generated at the substrate level to deposit a dielectric film on the substrate.

In one or more embodiments, a method of depositing a film comprises exposing a substrate to a precursor of general formula I

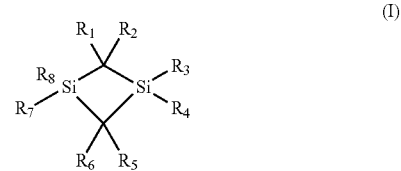

(I)

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide to deposit a dielectric film on the substrate.

In one or more embodiments, a non-transitory computer readable medium including instructions, that, when executed by a controller of a processing chamber, causes the processing chamber to perform operations of: flow a precursor-containing gas mixture into a processing volume of a processing chamber having a substrate, the precursor having the general formula (I)

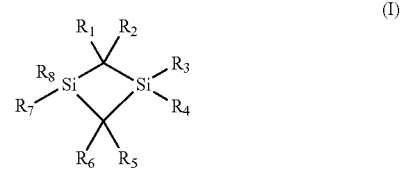

(I)

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide;

maintain the substrate at a pressure in a range of about 0.1 mTorr and about 10 Torr and at a temperature in a range of about 200° C. to about 500° C.; and generate a plasma at a substrate level to deposit a dielectric film on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
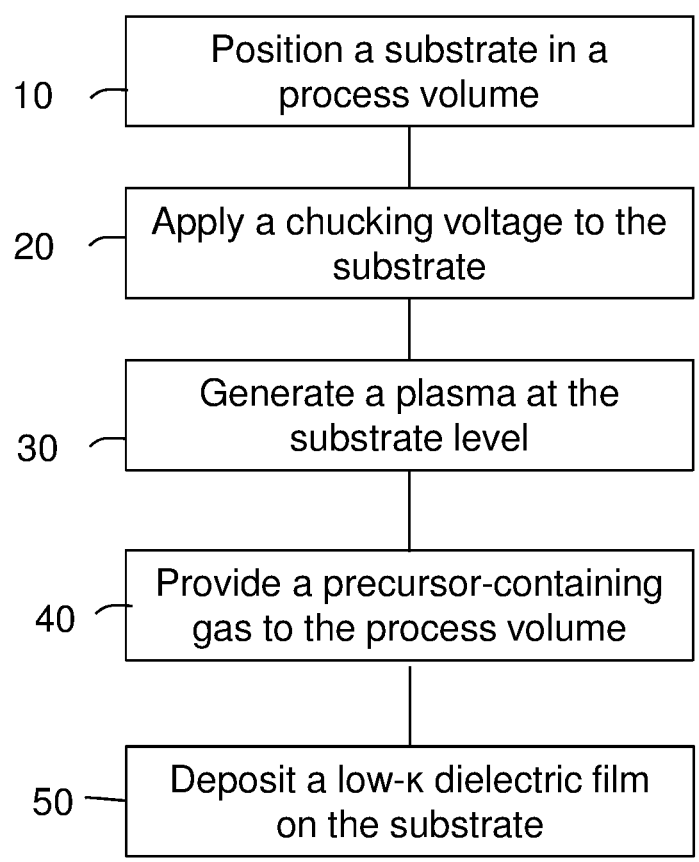
FIG. 1 depicts a flow diagram of a method for forming a low-κ dielectric film on a substrate in accordance with one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "reactive compound," "reactive gas," "reactive species," "precursor," "process gas," and the like are used interchangeably to mean a substance with a species capable of reacting with the substrate surface or material on the substrate surface in a surface reaction (e.g., chemisorption, oxidation, reduction). For example, a first "reactive gas" may simply adsorb onto the surface of a substrate and be available for further chemical reaction with a second reactive gas.

As used in this specification and the appended claims, the terms "precursor", "reactant", "reactive gas" and the like are used interchangeably to refer to any gaseous species that can react with the substrate surface.

In one or more embodiments, provided is a chemical vapor deposition (CVD) process for forming low-κ dielectric films using cyclic organosilane precursors. In one or more embodiments, the precursors contain a silacyclobutane functionality. In one or more embodiments, the liquid precursors are vaporized and flowed to a heated CVD chamber using an inert carrier gas (e.g. He, $N_2$, Ar, etc.), typically with an oxidizing co-reagent (e.g. $O_2$). In one or more embodiments, the gas mixture, at reduced pressure (e.g. about 0.1 mTorr to about 10 Torr), is ignited into a plasma using a direct, capacitively-coupled plasma (CCP) source at powers of about 100 to about 500 W, and the active radical and ion species react to form a low-κ dielectric film on a heated (about 200 to about 500° C.) substrate. In one or more embodiments, the as-deposited films are characterized by ellipsometry, FT-IR spectroscopy, XPS, and mercury probe to evaluate growth and material properties.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit films due to cost efficiency and film property versatility. In a PECVD process, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired amorphous carbon film thereon. Embodiments described herein in reference a PECVD process that can be carried out using any suitable thin film deposition system. Any apparatus description described herein is illustrative and should not be construed or interpreted as limiting the scope of the embodiments described herein.

Many applications in the semiconductor industry have very low thermal budget less than 400° C., even less than 300° C. in some circumstance. Typically, in a PECVD process, film quality is compromised greatly at low temperatures. Embodiments described herein advantageously provide methods for depositing high quality low-κ dielectric films for patterning and other applications that meet this stringent thermal budget without sacrificing film quality.

Conventional dielectric deposition processes often employ linear organosilanes, such as triethoxysilane (TEOS) or diethoxymethylsilane (DEMS). Typically, dielectric films formed from these linear organosilane precursors are post-processed (such as UV treatment or porogen decomposition) to lower the dielectric constant (κ) and increase the hardness. In one or more embodiments, bridged carbons are advantageously incorporated into the delivered precursor to enhance the hardness without post-treatment of the deposited film. Without intending to be bound by theory, it is thought that the increase in the concentration of bridged carbons in the film contributes to the increase in hardness of the film, while also keeping the dielectric film of the film low.

Embodiments described herein, include improved methods of fabricating dielectric films using silacyclobutane precursors. In one or more embodiments, the films produced using silacyclobutane precursors have high hardness and low dielectric constant. In one or more embodiments, the hardness and dielectric constant (κ) are dependent upon the specific film fabricated, but the films of one or more embodiments have similar or improved hardness when compared to films fabricated using precursors that are not silacyclobutane precursors. The dielectric films fabricated according to the embodiments described herein are amorphous in nature and have a higher hardness, greater than about 2.0 GPa, as measured by stylus nanoindentation measurements, than current patterning films.

In some embodiments, the dielectric films described herein may be formed by chemical vapor deposition (plasma enhanced and/or thermal) processes using precursor-containing gas mixtures including one or more precursor having the general formula (I):

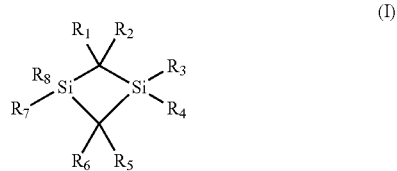

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide.

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

As used herein, the term "alkoxy" includes any of the above alkyl groups linked to an oxygen atom.

As used herein, the terms "vinyl" or "vinyl-containing" refer to groups containing the vinyl group (—CH═CH$_2$).

As used herein, the term "amine" relates to any organic compound containing at least one basic nitrogen atom, e.g. NR'$_2$, wherein R' is independently selected from hydrogen (H) or alkyl.

As used herein, the term "silane" refers to a compound SiR'$_3$, wherein R' is independently selected from hydrogen (H) or alkyl.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

In one or more specific embodiments, the precursor comprises one or more of diethoxydimethylsilacyclobutane (EMSCB) or tetramethylsilacyclobutane (TMSCB).

The deposition process may be carried out at temperatures ranging from about 200° C. to about 500° C., including about 225° C., about 250° C., about 275° C., about 300° C., about 325° C., about 350° C., about 375° C., about 400° C., about 425° C., about 450° C., about 475° C., and about 500° C.

The deposition process may be carried out in a process volume at pressures ranging from 0.1 mTorr to 10 Torr, including a pressure of about 0.1 mTorr, about 1 mTorr, about 10 mTorr, about 100 mTorr, about 500 mTorr, about 1 Torr, about 2 Torr, about 3 Torr, about 4 Torr, about 5 Torr, about 6 Torr, about 7 Torr, about 8 Torr, about 9 Torr, and about 10 Torr.

The precursor-containing gas mixture may further include one or more of a dilution gas selected from helium (He), argon (Ar), xenon (Xe), nitrogen (N$_2$), or hydrogen (H$_2$). The dilution gas of some embodiments comprises a compound that is inert gas relative to the reactants and substrate materials.

The precursor-containing gas mixture may further include etchant gases such as Cl$_2$, CF$_4$, or NF$_3$ to improve film quality.

The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 KHz, 2 MHz, 13.56 MHz, 27 MHz, 40 MHz, 60 MHz and 100 MHz, being used alternatively or simultaneously in a CVD system with any or all of the reactant gases listed herein to deposit a thin film of dielectric. In some embodiments, the plasma is a capacitively coupled plasma (CCP). In some embodiments, the plasma is an inductively coupled plasma (ICP). In some embodiments, the plasma is a microwave plasma.

In some embodiments, the low-κ dielectric film is deposited in a chamber with the substrate pedestal maintained at about 300° C., and the pressure maintained at about 5 Torr, with plasma generated at the wafer level (i.e., a direct plasma) by applying a bias of about 200 Watts to the electrostatic chuck. In some embodiments, an additional RF power of about 1000 Watts at 2 MHz is also delivered to the electrostatic chuck, generating a dual-bias plasma at the wafer level.

In general, the following exemplary deposition process parameters may be used to form the as-deposited low-κ dielectric film. The wafer temperature may range from about 200° C. to about 500° C. The chamber pressure may range from a chamber pressure in a range of about 0.1 mTorr to about 10 Torr. The flow rate of the precursor-containing gas mixture may be in a range from about 10 sccm to about 1,000 sccm. The flow rate of a dilution gas may individually range from about 50 sccm to about 50,000 sccm.

The low-κ dielectric film may be deposited to a thickness in a range of about 5 Å to about 60,000 Å, including a range of about 300 Å to about 10,000 Å, a range of about 2000 Å to about 3000 Å, or a range of about 5 Å to about 200 Å.

The as-deposited low-κ dielectric film may have a dielectric constant or extinction coefficient or κ-value in a range of about 2.8 to about 3.1, including about 2.8, about 2.85, about 2.9, about 2.95, about 3, about 3.05, or about 3.1.

The methods of one or more embodiments advantageously enable the fabrication of low-κ dielectric films having a high hardness, which have properties improved over films prepared using conventional precursors. In one or more embodiments, the as-deposited low-κ dielectric films have a hardness of greater than about 2, or a hardness in a range of about 2 to about 8 GPa, as measured by stylus nanoindentation measurements.

In one or more embodiments, the density of the low-κ dielectric film is greater than 1.8 g/cc, including greater than 1.9 g/cc, and including greater than 2.0 g/cc. In one or more embodiments, the density of the low-κ dielectric film is about 2.1 g/cc. In one or more embodiments, the density of the low-κ dielectric film is in a range of about greater than 1.8 g/cc to about 2.2 g/cc. In one or more embodiments, the density of the low-κ dielectric film is greater than about 2.2 g/cc.

Another advantage of the method of one or more embodiments is that a lower temperature process may be used to produce a low-κ dielectric film with the desired hardness. Ordinarily, higher substrate temperature during deposition is a process parameter used to encourage the formation of a harder film. When the precursors and the method of one or more embodiments are used together, surprisingly the substrate temperature may be reduced during deposition, for example to as low as about 200° C., and still produce a film of the desired hardness, i.e., a low-κ dielectric film with a hardness of about 2 to about 8 GPa, as measured by stylus nanoindentation measurements. Hence, the method of one or more embodiments may produce a relatively high hardness film, with a dielectric constant of about 3.

FIG. 1 depicts a flow diagram of a method 100 for forming a dielectric film on a on a substrate in accordance with one embodiment of the present disclosure. At operation 10, a substrate is positioned in a substrate volume. At operation 20, a chucking voltage is applied to the substrate. At operation 30, a plasma is generated at the substrate level. At operation 40, a precursor-containing gas is provided to the process volume. At operation 50, a low-κ dielectric film is deposited on the substrate. The dielectric film formed may be utilized, for example, as an insulating layer in a film stack.

Figure 2A:
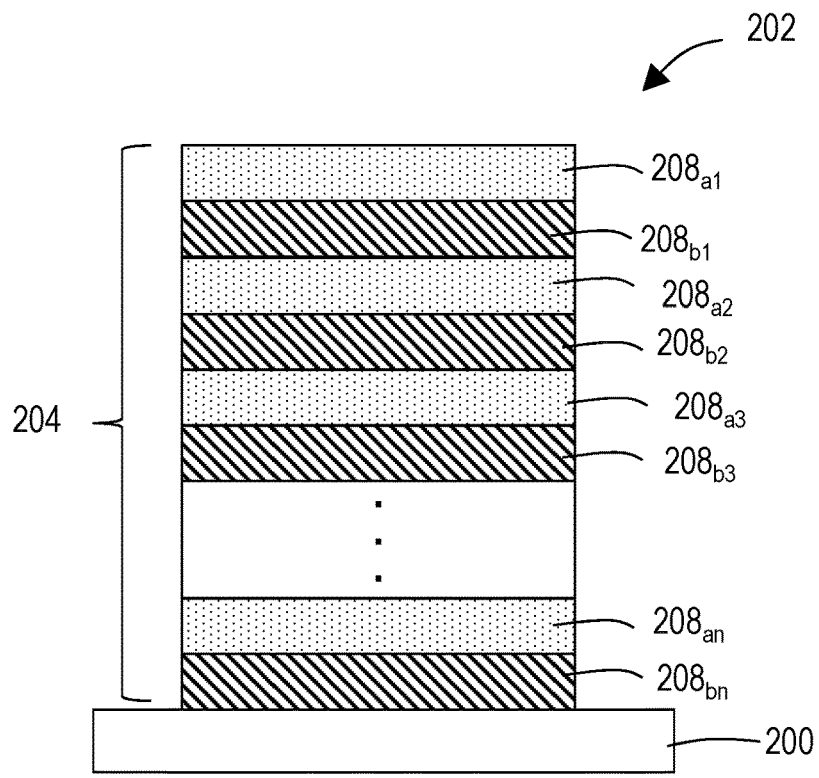
FIGS. 2A-2B depict one embodiment of a sequence for forming a low-κ dielectric film on a substrate in accordance with one or more embodiments.
Figure 2B:
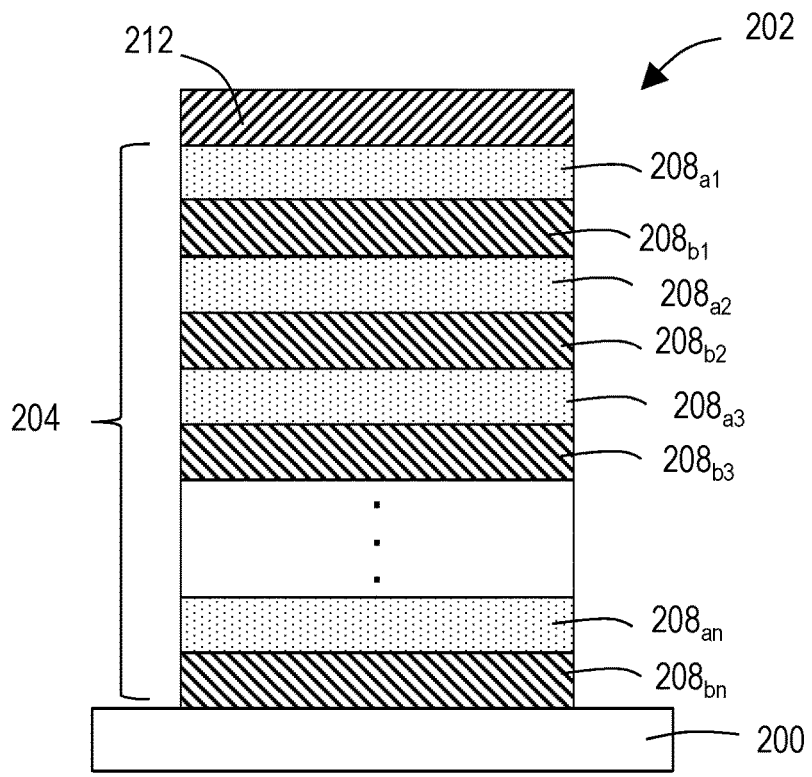

FIGS. 2A-2B are schematic cross-sectional views illustrating a sequence for forming a low-κ dielectric film on a film stack disposed on a substrate according to the method 100. Although the method 100 is described below with reference to a low-κ dielectric layer that may be formed on a film stack utilized to manufacture structures in the film stack for three dimensional semiconductor devices, the method 100 may also be used to advantage in other device manufacturing applications. Further, it should also be understood that the operations depicted in FIG. 1 may be performed simultaneously and/or in a different order than the order depicted in FIG. 1.

The method 100 begins at operation 10 by positioning a substrate, such as a substrate 200 depicted in FIG. 2A, into a process chamber. The substrate 200 may be positioned on an electrostatic chuck. The substrate 200 may be a silicon-based material or any suitable insulating material or conductive material as needed, having a film stack 204 disposed on the substrate 200 that may be utilized to form a structure 202 in the film stack 204.

As shown in the exemplary embodiment depicted in FIG. 2A, the substrate 200 may have a substantially planar surface, an uneven surface, or a substantially planar surface having a structure formed thereon. The film stack 204 is formed on the substrate 200. In one embodiment, the film stack 204 may be utilized to form a gate structure, a contact structure or an interconnection structure in a front end or back end process. The method 100 may be performed on the film stack 204 to form stair-like structures therein used in a memory structure, such as NAND structure. In one embodiment, the substrate 200 may be a material such as crystalline silicon (e.g., Si(100) or Si(111)), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 200 may have various dimensions, such as 200 mm, 300 mm, and 450 mm, or other diameter substrates, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 200, the substrate 200 may include a buried dielectric layer disposed on a silicon crystalline substrate. In the embodiment depicted herein, the substrate 200 may be a crystalline silicon substrate.

In one embodiment, the film stack 204 disposed on the substrate 200 may have a number of vertically stacked layers. The film stack 204 may comprise pairs including a first layer (shown as $208_{a1}$, $208_{a2}$, $208_{a3}$, ..., $208_{an}$) and a second layer (shown as $208_{b1}$, $208_{b2}$, $208_{b3}$, ..., $208_{bn}$) repeatedly formed in the film stack 204. The pairs includes alternating first layer (shown as $208_{a1}$, $208_{a2}$, $208_{a3}$, ..., $208_{an}$) and second layer (shown as $208_{b1}$, $208_{b2}$, $208_{b3}$, ..., $208_{bn}$) repeatedly formed until a predetermined number of pairs of the first layers and the second layers are reached.

The film stack 204 may be a part of a semiconductor chip, such as a three-dimensional memory chip. Although three repeating layers of first layers (shown as $208_{a1}$, $208_{a2}$, $208_{a3}$, ..., $208_{an}$) and second layers (shown as $208_{b1}$, $208_{b2}$, $208_{b3}$, ..., $208_{bn}$) are shown in FIGS. 2A-2B, it is noted that any desired number of repeating pairs of the first and the second layers may be utilized as needed.

In one embodiment, the film stack 204 may be utilized to form multiple gate structures for a three-dimensional memory chip. The first layers $208_{a1}$, $208_{a2}$, $208_{a3}$, ..., $208_{an}$, formed in the film stack 204 may be a first dielectric layer according to one or more embodiments and the second layers $208_{b1}$, $208_{b2}$, $208_{b3}$, ..., $208_{bn}$ may be a second dielectric layer according to one or more embodiments. Suitable dielectric films according to one or more embodiments may be utilized to form the first layers $208_{a1}$, $208_{a2}$, $208_{a3}$, ..., $208_{an}$ and/or the second layers $208_{b1}$, $208_{b2}$, $208_{b3}$, ..., $208_{bn}$ including, but not limited to, one or more of silicon, silicon nitride, silicon carbide, silicon oxide, silicon oxycarbide, silicon oxycarbonitride, silicon oxynitride, titanium nitride, or composite of oxide and nitride, at least one or more oxide layers sandwiching a nitride layer, and combinations thereof, among others.

In some embodiments, the first layers may be a high-κ material having a dielectric constant greater than 4. Suitable examples of the high-κ materials include, but are not limited to, hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT), among others.

In one particular example, the first layers $208_{a1}$, $208_{a2}$, $208_{a3}$, ..., $208_{an}$ are silicon oxide layers and the second layers $208_{b1}$, $208_{b2}$, $208_{b3}$, ..., $208_{bn}$ are silicon nitride layers or polysilicon layers disposed on the first layers $208_{a1}$, $208_{a2}$, $208_{a3}$, ..., $208_{an}$. In one embodiment, the thickness of first layers $208_{a1}$, $208_{a2}$, $208_{a3}$, ..., $208_{an}$ may be controlled at between about 50 Å and about 1000 Å, such as about 500 Å, and the thickness of the each second layers $208_{b1}$, $208_{b2}$, $208_{b3}$, ..., $208_{bn}$ may be controlled at between about 50 Å and about 1000 Å, such as about 500 Å. The film stack 204 may have a total thickness between about 100 Å and about 2000 Å. In one embodiment, a total thickness of the film stack 204 is about 3 microns to about 10 microns and will vary as technology advances.

The low-κ dielectric film of one or more embodiments may be formed on any surface or any portion of the substrate 200 with or without the film stack 204 present on the substrate 200.

At operation 20, in one or more embodiments, a chucking voltage is applied to an electrostatic chuck to clamp the substrate 200 to the electrostatic chuck. During operation 20, several process parameters may be regulated. In one embodiment suitable for processing a 300 mm substrate, the process pressure in the processing volume may be maintained at about 0.1 mTorr to about 10 Torr, including about 2 mTorr to about 50 mTorr, or about 5 mTorr to about 20 mTorr. In one embodiment suitable for processing a 300 mm substrate, the processing temperature and/or substrate temperature may be maintained at about 200° C. to about 500° C.

In one embodiment, a constant voltage is applied to the substrate 200. In some embodiments, a backside gas may be applied to the substrate 200 while applying the voltage to control the temperature of the substrate. Backside gases may include but are not limited to, helium (He), argon (Ar), or the like.

At operation 30, a plasma is generated at the substrate level. In one or more embodiments, at operation 30, a plasma is generated at the substrate level by applying a first RF bias to an electrostatic chuck. Plasma generated at the substrate level may be generated in a plasma region between the substrate and the electrostatic chuck. The first RF bias may be from about 10 Watts and about 3000 Watts at a frequency in a range of from about 350 KHz to about 100 MHz, including, but not limited to, 350 KHz, 2 MHz, 13.56 MHz, 27 MHz, 40 MHz, 60 MHz, or 100 MHz. In one or more embodiments, the first RF bias is provided at a power between about 2500 Watts and about 3000 Watts at a frequency of about 13.56 MHz. In one or more embodiments, the bias power is between about 10 Watts and about 3000 Watts. In one or more embodiments, the bias power is between about 2000 Watts and about 3000 Watts. In one or more embodiments, the bias power is between about 2500 Watts and about 3000 Watts.

During operation 40, a precursor-containing gas mixture is flowed into the processing volume to form the low-κ dielectric film on the film stack at operation 50. The precursor-containing gas mixture may be flowed into the processing volume through a gas distribution assembly. The precursor-containing gas mixture may include one or more precursor one or more precursor having the general formula (I):

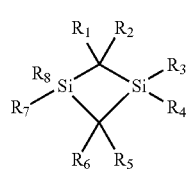

wherein $R^1$, $R^2$, $R^3$, $R^4$, $R^5$, $R^6$, $R^7$, and $R^8$ are independently selected from hydrogen (H), alkyl, alkoxy, vinyl, silane, amine, or halide.

The precursor-containing gas mixture may further include an inert gas, a dilution gas, a nitrogen-containing gas, an etchant gas, or combinations thereof. The precursor can be liquid or gas. In one or more embodiments, the precursor is a vapor at room temperature to simplify the hardware needed for material metering, control and delivery to the chamber. In some embodiments, the voltage supplied during operation 20 is maintained during operation 40. In some embodiments, the process conditions established during operation 20 and plasma formed during operation 30 are maintained during operation 40.

In some embodiments, the precursor-containing gas mixture further comprises one or more dilution gases. Suitable dilution gases such as helium (He), argon (Ar), xenon (Xe), hydrogen ($H_2$), nitrogen ($N_2$), ammonia ($NH_3$), or combinations thereof, among others, may be added to the gas mixture, if desired. Argon (Ar), helium (He), and nitrogen ($N_2$) are used to control the density and deposition rate of the dielectric film. In some cases, the addition of $N_2$ and/or $NH_3$ can be used to control the hydrogen ratio of the low-κ dielectric film, as discussed below. Alternatively, dilution gases may not be used during the deposition.

In some embodiments, the precursor-containing gas mixture further comprises one or more nitrogen-containing gases. Suitable nitrogen-containing compounds include, for example, pyridine, aliphatic amine, amines, nitriles, ammonia and similar compounds.

In some embodiments, the precursor-containing gas mixture further comprises an inert gas. In some embodiments, an inert gas, such as argon (Ar) and/or helium (He) may be supplied with the precursor-containing gas mixture into the processing volume. Other inert gases, such as nitrogen ($N_2$) and nitric oxide (NO), may also be used to control the density and deposition rate of the dielectric film. Additionally, a variety of other processing gases may be added to the precursor-containing gas mixture to modify properties of the low-κ dielectric film material. In one or more embodiments, the other processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio of the deposited low-κ dielectric film. The hydrogen ratio present in the dielectric film provides control over layer properties, such as reflectivity.

In some embodiments, the precursor-containing gas mixture further comprises an etchant gas. Suitable etchant gases include chlorine ($Cl_2$), carbon tetrafluoride ($CF_4$), nitrogen trifluoride ($NF_3$), or combinations thereof.

In some embodiments, after the low-k dielectric film 212 is formed on the substrate during operation 40, the low-k dielectric film 212 is exposed to hydrogen radicals. In some embodiments, the low-k dielectric film 212 is exposed to hydrogen radicals during the deposition process of operation 40. In some embodiments, the hydrogen radicals are formed in an RPS and are delivered to the processing region.

At operation 50, after the low-k dielectric film 212 is formed on the substrate, the substrate is de-chucked. During operation 50, the chucking voltage is turned-off. The reactive gases are turned-off and optionally purged from the processing chamber. In one or more embodiments, during operation 50, RF power is reduced (e.g., ~200 W). The remaining gases are then purged from the processing chamber. The processing chamber is pumped down and the substrate is transferred out of the chamber.

After the low-k dielectric film 212 is formed on the substrate, the low-k dielectric film 212 may be utilized in an etching process as a patterning mask to form a three-dimensional structure. The low-κ dielectric film 212 may be patterned using a standard photoresist patterning technique. A patterned photoresist (not shown) may be formed over the low-κ dielectric film 212. The low-κ dielectric film 212 may be etched in a pattern corresponding with the patterned photoresist layer followed by etching the pattern into the substrate 200. Material may be deposited into the etched portions of the low-κ dielectric film 212. The low-κ dielectric film 212 may be removed using a solution comprising hydrogen peroxide and sulfuric acid. The low-κ dielectric film 212 may also be removed using etch chemistries containing oxygen and halogens, including, but not limited to, chlorine (CI), fluorine (F), iodine (I), bromine (Br), and astatine (At). The low-κ dielectric film 212 may be removed by a chemical mechanical polishing (CMP) process.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

Deposited films of diethoxymethylsilane (DEMS), diethoxydimethylsilacyclobutane (EMSCB), and tetramethylsilacyclobutane (TMSCB) were compared. The organosilane precursors were tested in similar process regimes. Table 1 shows the results for each respective precursor. Conditions were adjusted to be roughly center of the process windows capable of producing films with reasonable deposition rates and uniformity. Films were deposited as a function of the following process variables: stage position, plasma power, $O_2$ flow rate, carrier flow rate, precursor flow, chamber pressure, and stage temperature.

Films deposited using the silacyclobutane precursors show higher concentrations of Si—$CH_2$—Si bonding compared to the linear precursor.

TABLE 1

| Comparison of non-silacyclobutane precursor and silacyclobutane precursors | | | |
|---|---|---|---|
| | DEMS | EMSCB | TMSCB |
| κ | 2.79 | 2.98 | 3.03 |
| Hardness | 1.67 | 5.57 | 4.4 |

Several IR modes were regressed against the dielectric constant (κ) and hardness (H). A low $SiCH_xSiO$ ratio was correlated with both higher κ and higher hardness. For similar values of κ, using the silacyclobutane precursors produced films with significantly higher hardness.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate, the method comprising:
    flowing a precursor-containing gas mixture into a processing volume of a processing chamber having a substrate, the precursor-containing gas mixture comprising a precursor having the general formula (I)

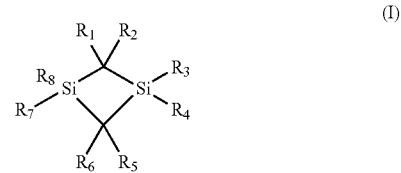

wherein $R^1$, $R^2$, $R^3$, $R^4$, $R^5$, $R^6$, $R^7$, and $R^8$ are independently selected from vinyl, silane, amine, or halide and an oxidizing co-reagent;
    maintaining the substrate at a pressure in a range of about 0.1 mTorr and about 10 Torr and at a temperature in a range of about 200° C. to about 500° C.; and
    generating a plasma at a substrate level to deposit a dielectric film on the substrate.

2. The method of claim 1, wherein the dielectric film has a κ-value in a range of about 2.8 to about 3.1.

3. The method of claim 1, wherein the dielectric film has a hardness in a range of about 2 to about 8.

4. The method of claim 1, wherein the precursor-containing gas mixture comprises one or more dilution gas selected from helium (He), argon (Ar), xenon (Xe), krypton (Kr), nitrogen ($N_2$), or hydrogen ($H_2$).

5. The method of claim 1, wherein the dielectric film comprises one or more of silicon, silicon nitride, silicon carbide, silicon oxide, silicon oxycarbide, silicon oxycarbonitride, silicon oxynitride, titanium nitride, or composite of oxide and nitride.

6. The method of claim 1, wherein generating the plasma at the substrate level comprises applying a first RF bias to an electrostatic chuck to deposit the dielectric film on the substrate.

7. The method of claim 6, further comprising applying a second RF bias to the electrostatic chuck to generate the plasma at the substrate level, wherein the second RF bias is provided at a power in a range of about 10 Watts to about 3000 Watts and at a frequency in a range of about 350 KHz to about 100 MHz.

8. The method of claim 6, wherein the first RF bias is provided at a power in a range of about 10 Watts to about 3000 Watts and at a frequency in a range of about 350 KHz to about 100 MHz.

9. The method of claim 6, further comprising applying a chucking voltage to the substrate positioned on the electrostatic chuck.

10. A method of depositing a film, the method comprising:
exposing a substrate to a precursor of general formula I

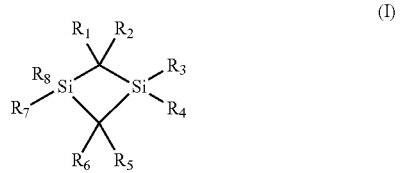

(I)

wherein $R^1$, $R^2$, $R^3$, $R^4$, $R^5$, $R^6$, $R^7$, and $R^8$ are independently selected from vinyl, silane, amine, or halide and an oxidizing co-reagent to deposit a dielectric film on the substrate.

11. The method of claim 10, further comprising generating a plasma at a substrate level to deposit the dielectric film on the substrate.

12. The method of claim 11, wherein generating the plasma at the substrate level comprises applying a first RF bias to an electrostatic chuck to deposit the dielectric film on the substrate, wherein the first RF bias is provided at a power in a range of about 10 Watts to about 3000 Watts and at a frequency in a range of about 350 KHz to about 100 MHz.

13. The method of claim 12, further comprising applying a second RF bias to the electrostatic chuck to generate the plasma at the substrate level, wherein the second RF bias is provided at a power in a range of about 10 Watts to about 3000 Watts and at a frequency in a range of about 350 KHz to about 100 MHz.

14. The method of claim 10, wherein the dielectric film has a κ-value in a range of about 2.8 to about 3.1.

15. The method of claim 10, wherein the dielectric film has a hardness in a range of about 2 to about 8.

16. The method of claim 10, further comprising exposing the substrate to one or more dilution gas selected from helium (He), argon (Ar), xenon (Xe), krypton (Kr), nitrogen ($N_2$), or hydrogen ($H_2$).

17. The method of claim 10, wherein the dielectric film comprises one or more of silicon, silicon nitride, silicon carbide, silicon oxide, silicon oxycarbide, silicon oxycarbonitride, silicon oxynitride, titanium nitride, or composite of oxide and nitride.

18. A non-transitory computer readable medium including instructions, that, when executed by a controller of a processing chamber, causes the processing chamber to perform operations of:
flow a precursor-containing gas mixture into a processing volume of a processing chamber having a substrate, the precursor-containing gas mixture comprising a precursor having the general formula (I)

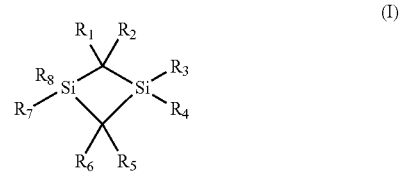

(I)

wherein $R^1$, $R^2$, $R^3$, $R^4$, $R^5$, $R^6$, $R^7$, and $R^8$ are independently selected from vinyl, silane, amine, or halide and an oxidizing co-reagent;
maintain the substrate at a pressure in a range of about 0.1 mTorr and about 10 Torr and at a temperature in a range of about 200° C. to about 500° C.; and
generate a plasma at a substrate level to deposit a dielectric film on the substrate.

* * * * *